(12) United States Patent
Greenslade

(10) Patent No.: US 12,184,303 B2
(45) Date of Patent: Dec. 31, 2024

(54) SINGLE-ENDED ANALOG SIGNAL RECEIVER APPARATUS

(71) Applicant: HARMAN INTERNATIONAL INDUSTRIES, INCORPORATED, Stamford, CT (US)

(72) Inventor: Jason Anthony Greenslade, Guangdong (CN)

(73) Assignee: Harman International Industries, Incorporated, Stamford, CT (US)

( * ) Notice: Subject to any disclaimer, the term of this patent is extended or adjusted under 35 U.S.C. 154(b) by 148 days.

(21) Appl. No.: 17/982,352

(22) Filed: Nov. 7, 2022

(65) Prior Publication Data
US 2023/0155604 A1 May 18, 2023

(30) Foreign Application Priority Data
Nov. 12, 2021 (CN) .......................... 202111340141.4

(51) Int. Cl.
*H03M 1/00* (2006.01)
*H03M 1/20* (2006.01)
(Continued)

(52) U.S. Cl.
CPC ........... *H03M 1/808* (2013.01); *H03M 1/205* (2013.01); *H03M 1/504* (2013.01)

(58) Field of Classification Search
CPC .. H03F 3/45475; H03F 2200/03; H03F 3/187; H03F 2203/45138; H03F 3/45941; H03F 2203/45418; H03F 2200/129; H03F 2203/45116; H03F 2203/45424; H03F 2203/45552; H03F 2203/45512; H03F 2203/45518; H03F 2203/45528; H03F 2203/45544; H03F 2203/45594; H03F 3/183; H03F 3/68; H03F 1/0211; H03F 1/3211; H03F 1/34; H03F 2200/228; H03F 2200/261; H03F 2200/331; H03F 2200/441; H03F 2203/45112; H03F 2203/45541; H03F 2203/45571; H03F 2203/45586; H03F 3/181; H03F 3/45071; H03F 3/45076; H04R 19/04; H04R 19/005;
(Continued)

(56) References Cited

U.S. PATENT DOCUMENTS 4,152,659 A     5/1979   Gordon
4,242,741 A  *  12/1980  Parrish ..................... G01V 1/22
                                                          330/84
(Continued)

FOREIGN PATENT DOCUMENTS

WO           9619866 A1     6/1996

OTHER PUBLICATIONS

European Search Report dated Apr. 4, 2023 for European Patent Application No. 22205823.2, 10 pages.

*Primary Examiner* — Linh V Nguyen
(74) *Attorney, Agent, or Firm* — Brooks Kushman P.C.

(57) ABSTRACT

A single-ended analog signal receiver apparatus is provided, which can cope with an external ground current and an undefined impedance through an AC bootstrap input impedance, while considering electromagnetic compatibility, convert a received single-ended analog signal into a balanced output differential signal, and may provide at a post-stage circuit output an output signal with lower noise through common mode rejection.

14 Claims, 5 Drawing Sheets

(51) Int. Cl.
*H03M 1/50* (2006.01)
*H03M 1/80* (2006.01)

(58) Field of Classification Search
CPC ............... H04R 2201/003; H04R 3/00; H04R 2499/11; H04R 29/004; H04R 2410/03; H04R 3/007; H04R 3/02; H04R 3/06; H03M 1/1205; H03M 1/1245; H03M 1/129; H03M 1/183; H03M 1/188
USPC ........... 341/139, 140, 155; 330/69, 258, 260
See application file for complete search history.

(56) References Cited

U.S. PATENT DOCUMENTS

| | | | | |
|---|---|---|---|---|
| 5,568,561 | A * | 10/1996 | Whitlock | H03F 3/45475 |
| | | | | 330/69 |
| 6,396,343 | B2 * | 5/2002 | Chee | H03F 3/45968 |
| | | | | 330/69 |
| 7,190,217 | B2 * | 3/2007 | Dai | H03F 3/45968 |
| | | | | 330/69 |
| 8,855,335 | B2 * | 10/2014 | Henriksen | H04R 3/06 |
| | | | | 341/118 |
| 9,461,598 | B2 * | 10/2016 | Wen | H03F 3/187 |
| 9,973,160 | B2 * | 5/2018 | Chiang | H03F 3/45946 |
| 10,419,014 | B2 * | 9/2019 | Pachchigar | H03M 1/188 |
| 10,979,009 | B2 * | 4/2021 | Werking | H03F 3/45071 |
| 2005/0116773 | A1 * | 6/2005 | Laletin | G01R 31/31716 |
| | | | | 330/69 |
| 2005/0237109 | A1 * | 10/2005 | Laletin | H03F 3/211 |
| | | | | 330/84 |
| 2019/0074803 | A1 | 3/2019 | Marino | |

* cited by examiner

SINGLE-ENDED ANALOG SIGNAL RECEIVER APPARATUS

CROSS-REFERENCE TO RELATED APPLICATIONS

This application claims priority to CN application Serial No. 202111340141.4 filed Nov. 12, 2021, the disclosure of which is hereby incorporated in its entirety by reference herein.

TECHNICAL FIELD

The present disclosure generally relates to amplifying and transmitting-receiving units of audio signals, and more particularly, the present disclosure relates to a receiver apparatus configured to receive a single-ended analog signal and provided with a ground lift.

BACKGROUND

A sound system may be composed of a plurality of electronic devices that are physically far apart and connected to each other by cables. For an analog signal, especially a single-ended signal, noise is sometimes induced by a ground current or "ground loop" generated due to a voltage difference between respective ground points of two or more devices. For example, if a signal source apparatus and a receiver share the ground or have a coupled ground terminal with a hidden current or signal, redundant noise will be introduced into a useful signal input to the receiver. If the ground loop cannot be disconnected, the noise can usually be alleviated by adding a series-connected impedance at a receiving terminal, that is, a ground lift, i.e., a floating ground is set. The floating ground impedance converts current noise into voltage noise, and a simple differential amplifying circuit can be used for eliminating common mode signal noise by implementing common mode rejection (CMRR) for differential signal transmission, while capturing an expected differential mode signal. However, a disadvantage of this type of circuit is that a high-impedance component may add noise, a floating source becomes noisy, and it is also susceptible to an unavoidable interference between ungrounded or floating devices.

Therefore, there is still a need to design a receiver apparatus for audio signal input that can transmit a source signal from one device component to another device component, thereby removing ground noise while avoiding audio pollution.

SUMMARY

A single-ended analog signal receiver apparatus is provided in the present disclosure, and is used for receiving a single-ended analog signal from an input signal terminal and outputting an output signal relative to a local ground terminal at an output terminal. An input reference terminal of the single-ended analog signal is connected to the local ground terminal of the receiver apparatus through a series-connected bias resistor to form a ground lift, so that a floating ground signal that generates voltage noise may be buffered and amplified by using a pre-stage calibrated buffer gain unit in the receiver apparatus to match a post-stage balance circuit unit, and then completely eliminated by common mode rejection, thereby outputting a signal with less noise.

In one aspect, the single-ended analog signal receiver apparatus provided by the present disclosure includes a buffer gain unit and a post-stage balance circuit unit with a common mode rejection function. The buffer gain unit includes a first input terminal connected to the input reference terminal of the single-ended analog signal receiver apparatus, a second input terminal connected to the local ground terminal, and a buffer gain output terminal connected to a second post-stage input terminal of the post-stage balance circuit unit.

The post-stage balance circuit unit includes a first post-stage input terminal, the second post-stage input terminal, and a post-stage output terminal. The first post-stage input terminal is connected to the input signal terminal of the single-ended analog signal receiver apparatus, and the second post-stage input terminal is connected to the buffer gain output terminal of the buffer gain unit to receive an amplified floating ground signal output by the buffer gain unit, and the post-stage output terminal is connected to the output terminal of the single-ended analog signal receiver apparatus for providing an output signal.

Two ends of the bias resistor are connected to a first buffer gain input terminal and a second buffer gain input terminal of the buffer gain unit, respectively. Therefore, the floating ground signal generated on the bias resistor is first buffered and amplified in the buffer gain unit, so that even if the post-stage balance circuit unit has an unmatched input impedance, the calibrated buffer gain unit can use the amplification amount of the floating ground signal to match an input of the post-stage balance circuit unit, so that the post-stage balance circuit unit can completely suppress common mode noise through common mode rejection.

In another aspect, a single-ended analog signal receiver apparatus provided by the present disclosure may include a buffer gain unit having a first buffer gain input terminal, a second buffer gain input terminal, a first buffer gain output terminal, and a second buffer gain output terminal. A first bias resistor is connected in series between an input reference terminal of a single-ended analog signal received by the single-ended analog signal receiver apparatus and a local ground terminal, and a floating ground signal of voltage noise may be formed on the first bias resistor. A second bias resistor is connected in series between an input signal terminal and the first buffer gain input terminal of the buffer gain unit, and a third bias resistor is connected in series between the input reference terminal and the second buffer gain input terminal of the buffer gain unit. Moreover, a fourth bias resistor is connected in series between the first buffer gain input terminal of the buffer gain unit and the local ground terminal, and a fifth bias resistor is connected in series between the second buffer gain input terminal of the buffer gain unit and the local ground terminal. Resistance values of the second bias resistor and the third bias resistor are matched, and resistance values of the fourth bias resistor and the fifth bias resistor are matched, so that the receiver apparatus has a balanced input impedance.

The buffer gain unit further includes a first operational amplifier and a second operational amplifier, and a first gain resistor, a second gain resistor, and a third gain resistor, wherein a non-inverting input terminal of the first operational amplifier is connected to the first buffer gain input terminal of the buffer gain unit, a non-inverting input terminal of the second operational amplifier is connected to the second buffer gain input terminal of the buffer gain unit, the first gain resistor is connected between an inverting input terminal and an output terminal of the first operational amplifier, the second gain resistor is connected between the inverting input terminal of the first operational amplifier and an inverting input terminal of the second operational amplifier, and the third gain resistor is connected between the inverting input terminal and an output terminal of the second operational amplifier, wherein the respective output terminals of the first operational amplifier and the second operational amplifier are connected to the first buffer gain output terminal and the second buffer gain output terminal of the buffer gain unit, respectively. A sum of resistance values of the first gain resistor and the second gain resistor in the buffer gain unit matches a resistance value of the third gain resistor. Therefore, the buffer gain unit is applicable to have a balanced differential output, and can directly deliver the common mode floating ground signal to a post-stage circuit unit with the common mode rejection function for noise elimination.

In the provided single-ended analog signal receiver, the post-stage of the buffer gain unit may further be connected to a post-stage balance circuit unit with the common mode rejection function. The post-stage balance circuit unit includes a first post-stage input terminal connected to the first buffer gain output terminal of the buffer gain unit, a second post-stage input terminal connected to the second buffer gain output terminal of the buffer gain unit, and a post-stage output terminal. The post-stage output terminal is connected to the output terminal of the single-ended analog signal receiver apparatus to provide an output signal.

A single-ended analog signal receiver apparatus provided in still another aspect of the present disclosure includes a buffer gain unit with the same configuration as the previous aspect, a post-stage balance circuit unit with a common mode rejection function, and a unity-gain amplifier unit. An input signal terminal and an input reference terminal of the single-ended analog signal receiver apparatus have unmatched output impedances, and unbalanced input impedances.

The provided single-ended analog signal receiver apparatus includes a first bias resistor and a second bias resistor connected in series between a first buffer gain input terminal and a second buffer gain input terminal of the buffer gain unit, a third bias resistor connected between a node between the first bias resistor and the second bias resistor and a local ground terminal, a fourth bias resistor connected between the input signal terminal of the single-ended analog signal receiver apparatus and the first buffer gain input terminal of the buffer gain unit, and a fifth bias resistor connected between the input reference terminal of the single-ended analog signal receiver apparatus and the second buffer gain input terminal of the buffer gain unit. Therefore, the second bias resistor, the third bias resistor, and the fifth bias resistor constitute a series-connected floating ground resistor and form a floating ground signal of voltage noise. Moreover, a sixth bias resistor and a seventh bias resistor are connected in series sequentially between the first buffer gain output terminal and the second buffer gain output terminal of the buffer gain unit. The unity-gain amplifier unit includes one operational amplifier, an input terminal formed by a non-inverting input terminal thereof is connected to a node between the sixth and seventh bias resistors, and an inverting input terminal thereof is connected to an output terminal. A first capacitor is connected between the output terminal of the unity-gain amplifier unit and a node between the first, second, and third bias resistors. The first capacitor is sized to have an impedance less than a resistance value of the third bias resistor at a frequency higher than a first predetermined frequency. The buffer gain unit further includes a second capacitor and a third capacitor connected in series between the input signal terminal and the input reference terminal of the unity-gain amplifier unit, a fourth capacitor connected between a node between the second capacitor and the third capacitor and the local ground terminal, and an eighth bias resistor connected between the output terminal of the unity-gain amplifier unit and the second, third, and fourth capacitors. The fourth capacitor is sized to have an impedance less than a resistance value of the eighth bias resistor at a frequency lower than a second predetermined frequency. Since the unity-gain unit couples a common mode noise voltage signal delivered by the buffer gain unit at a unity-gain and feeds back to the input impedance of the receiver apparatus, the first and second bias resistors and the second and third capacitors can present bootstrap, respectively and therefore, the receiver apparatus can overcome the mismatch of the output impedance of the receiving terminal, so that the input impedances reach a balance, and the electromagnetic compatibility is also taken into account, thereby realizing the elimination of the floating ground noise.

BRIEF DESCRIPTION OF THE DRAWINGS

These and/or other features, aspects, and advantages of the present disclosure will be better understood after reading the following detailed description with reference to accompanying drawings, throughout which identical characters represent identical components, wherein.

DETAILED DESCRIPTION

Embodiments of the present disclosure are described in detail below; however, it is to be understood that the disclosed embodiments are merely examples that may be embodied in various alternative forms. The accompanying drawings are not necessarily drawn to scale; some features may be exaggerated or minimized to show details of particular components. Therefore, specific structural and functional details disclosed herein should not be interpreted as limiting, but merely as a representative basis for teaching those skilled in the art to implement the present disclosure in various manners.

As used in the present disclosure, elements or steps that are referenced in the singular form and modified with the word "a" or "an" should be understood as not excluding a plurality of the elements or steps, unless such exception is specifically stated. Furthermore, references to "embodiments" or "examples" of the present disclosure are not intended to be construed as exclusive, and other embodiments of the recited features also exist. The terms "first,"

"second," "third," and the like are used only for identification and are not intended to emphasize a quantity requirement or positioning order of objects thereof.

When a signal source apparatus and a receiver share a ground or have a coupled ground terminal with a hidden current or signal, a ground current flowing in a formed ground loop may impose noise on a ground connection. For examples that can be seen in everyday life, when a USB is used for charging a mobile phone with an audio output connected back to a charging unit, a charging current is quite high and noise is also high. Therefore, a local ground terminal is usually arranged at a point in a local signal circuit as a local reference ground, and ground noise is suppressed by adding a series-connected impedance to an audio signal. Although the floating ground impedance should preferably be added in the audio signal where the current is low, the floating ground impedance still produces a floating ground impedance signal, which is a voltage noise signal with a property of a common-mode signal. Conventional use of a differential amplifier can effectively remove common mode voltage noise through common mode rejection. However, the differential amplifier is limited by matching of an input impedance and an element, and the additionally required impedance component of the amplifier creates more noise.

A single-ended analog signal receiver apparatus is provided in the present disclosure and is used for receiving a single-ended analog input signal at a receiving terminal of a cable and outputting an output signal with lower noise at an output terminal. A typical single-ended signal input terminal includes one signal terminal, and a reference terminal thereof is generally ground.

Figure 1:
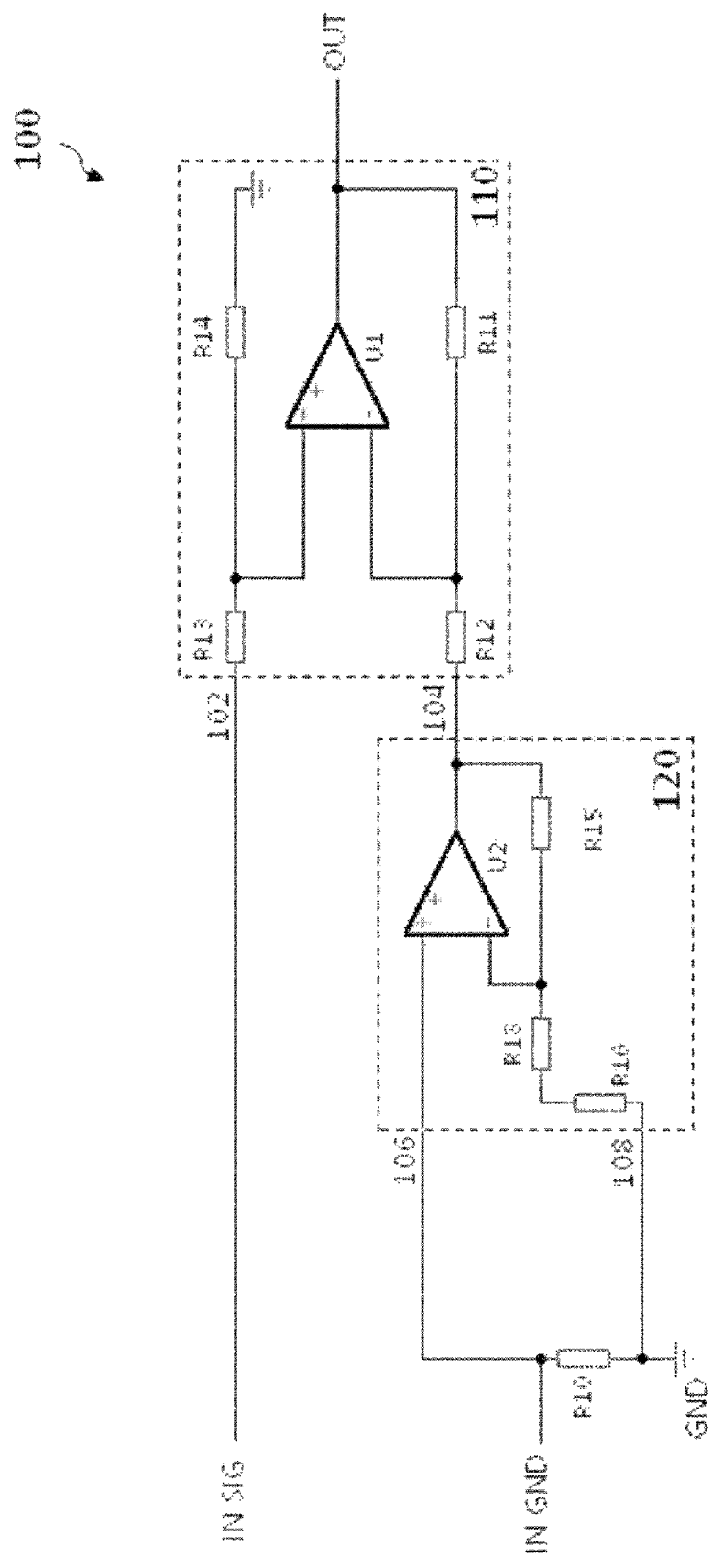
FIG. 1 is an example structural diagram of a single-ended analog signal receiver apparatus according to one or more embodiments of the present disclosure.

In one example, as shown in FIG. 1, single-ended analog signal receiver apparatus 100 receives a single-ended analog input signal at an input terminal. The input terminal includes an input signal terminal marked as IN SIG and an input reference terminal marked as IN GND. In order to eliminate ground current noise, single-ended analog signal receiver apparatus 100 is connected to floating ground resistor R10 at input reference terminal IN GND, so that input reference terminal IN GND is connected to a local reference ground via floating ground resistor R10, that is, locally arranged ground terminal GND. Therefore, the local signal reference becomes local ground terminal GND on the side of resistor R10. Due to the connection of a floating ground resistor R10, a ground current flowing on floating ground resistor R10 generates a floating ground signal. The floating ground signal is a useless noise voltage signal, and therefore, the noise voltage signal should be carefully sensed, and subtracted from the signal.

Single-ended analog signal receiver apparatus 100 includes differential amplifier 110 in the hope of effectively removing noise through common mode rejection. As can be seen, differential amplifier 110 is configured in the form of a voltage mode differential amplifier having non-inverting input terminal 102, inverting input terminal 104, and an output terminal. Differential amplifier 110 internally includes operational amplifier U1 and four gain resistors R11, R12, R13, and R14. Gain resistor R11 is connected to an output terminal and an inverting input terminal of operational amplifier U1, gain resistor R12 is connected to the inverting input terminal of operational amplifier U1 and inverting input terminal 104 of differential amplifier 110, gain resistor R13 is connected to a non-inverting input terminal of operational amplifier U1 and non-inverting input terminal 102 of differential amplifier 110, and gain resistor R14 are connected to the non-inverting input terminal of operational amplifier U1 and ground terminal GND.

Using the common mode rejection function of differential amplifier 110 may be expected to eliminate the common mode floating ground noise signal generated by floating ground resistor R10, but more noise will be generated due to the addition of a high impedance resistor. In order that differential amplifier 110 can ideally eliminate the floating ground signal while avoiding the noise generated by the resistor, and at the same time overcome the problem that a noise gain in an inverting path is higher than a signal gain, receiver apparatus 100 provided by the present disclosure is further provided with buffer gain unit 120 at the pre-stage of the differential amplifier. As shown in FIG. 1, non-inverting input terminal 106 and inverting input terminal 108 provided by buffer gain unit 120 are respectively connected to upper and lower ends of the floating ground resistor R10, so as to feed the floating ground signal generated on floating ground resistor R10 into amplifier unit 120 for amplification, thereby being capable of matching the post-stage differential amplifier.

Buffer gain unit 120 is configured in the form of a non-inverting amplifier circuit. Buffer gain unit 120 includes operational amplifier U2 and two gain resistors R15 and R16. Non-inverting input terminal 106 of buffer gain unit 120 is connected to a non-inverting input terminal of operational amplifier U2. Gain resistor R15 is connected to an inverting input terminal and an output terminal of operational amplifier U2. Gain resistor R16 is connected to the inverting input terminal of operational amplifier U2 and inverting input terminal 108 of buffer gain unit 120, and is connected to a ground terminal. As can be seen from FIG. 1, an output terminal of buffer gain unit 120 is connected to inverting input terminal 104 of post-stage differential amplifier 110, and therefore, buffer gain unit 120 plays a role of buffering and amplifying the floating ground signal here. The floating ground signal amplified by buffer gain unit 120 is output from the output terminal and then added to a post-stage feedback network, so as to be subtracted from the signal.

In addition, performing the amplifier calibration enables buffer gain unit 120 to compensate for a difference in differential gains between the non-inverting input and the inverting input of post-stage differential amplifier 110. For example, a situation with almost no additional noise can be obtained by carefully selecting the most preferred possible impedance value so that an amplification value of the floating ground signal matches a single-ended amplification feedback value of the post-stage differential amplifier unit. The amplification value of the floating ground signal of pre-stage buffer gain unit 120 depends on gain resistors R15 and R16 in buffer gain unit 120, and the inverting single-ended amplification feedback value of post-stage differential amplifier 110 depends on inverting gain resistors R11 and R12. A method of calibration is matching the gain value of buffer gain unit 120 with the post-stage single-ended amplification feedback value, that is, R11=R16 and R12=R15. An example configuration of resistance values is that a resistance value of the floating ground resistor R10 is 5 Ohm, resistance values of the gain resistors in buffer gain unit 120 are set as R15=330 Ohm and R16=1K Ohm, and resistance values of the gain resistors in matching post-stage balance circuit unit 110 are set as R1=1K Ohm and R12=330 Ohm, that is, the resistance values of gain resistors R12 and R15 are matched, and the resistance values of gain resistors R11 and R16 are matched. Therefore, differential amplifier 110 can achieve balance, completely remove the floating ground signal noise and cancel self-noise generated by the resistance value of the differential amplifier, so that differential amplifier 110 forms a post-stage balance circuit unit in the receiver apparatus.

Preferably, compensation resistor R18 may further be added for compensating for attenuation of the resistors in the circuit connected to the receiver apparatus. These resistors include, for example, but are not limited to, the attenuation of non-inverting gain resistors R13 and R14 of differential amplifier 110. It should be noted that non-inverting gain resistors R13 and R14 do not need to match R12 and R11, respectively, thereby allowing R13 to be in a low impedance to keep low noise, and R14 to be in a high impedance to meet an input impedance requirement. In addition, the attenuation of the input impedance (not shown) at the signal input terminal may also be considered. Compensation resistor R18 may be arranged, for example, in series with gain resistor R16 of buffer gain unit 120. FIG. 1 exemplarily shows that compensation resistor R18 is connected in series between the inverting input terminal of operational amplifier U1 in buffer gain unit 120 and gain resistor R16. An example resistor configuration is that non-inverting gain resistors of differential amplifier U1 are R13=100 Ohm and R14=22 k Ohm. A resistance value of compensation resistor R18 is preset to 19 Ohm here, and another suitable resistance value is also available. If possible, the preset resistor R18 may also be incorporated into gain resistor R16 of buffer gain unit 120.

To sum up, in single-ended analog signal receiver apparatus 100 shown in FIG. 1, the floating ground signal generated by floating ground resistor R10 is first buffered and amplified in buffer gain unit 120, so that even if the post-stage balance circuit unit has unmatched high non-inverting input impedance and low inverting input impedance, impedance-calibrated buffer gain unit 120 can also use the amplification amount of the noise voltage signal to match the input of the post-stage balance circuit unit. Moreover, the difference in differential gains of the two input terminals of the differential amplifier unit may also be compensated by calibrating buffer gain unit 120, so that the gain of the post-stage balance circuit unit for the common mode voltage signal is 0; therefore, any common mode voltage input to the post-stage balance circuit unit is basically suppressed. As for the useful signal of differential mode, it is output by the output terminal of the post-stage balance circuit unit, and an output signal with lower noise can be obtained.

Figure 2:
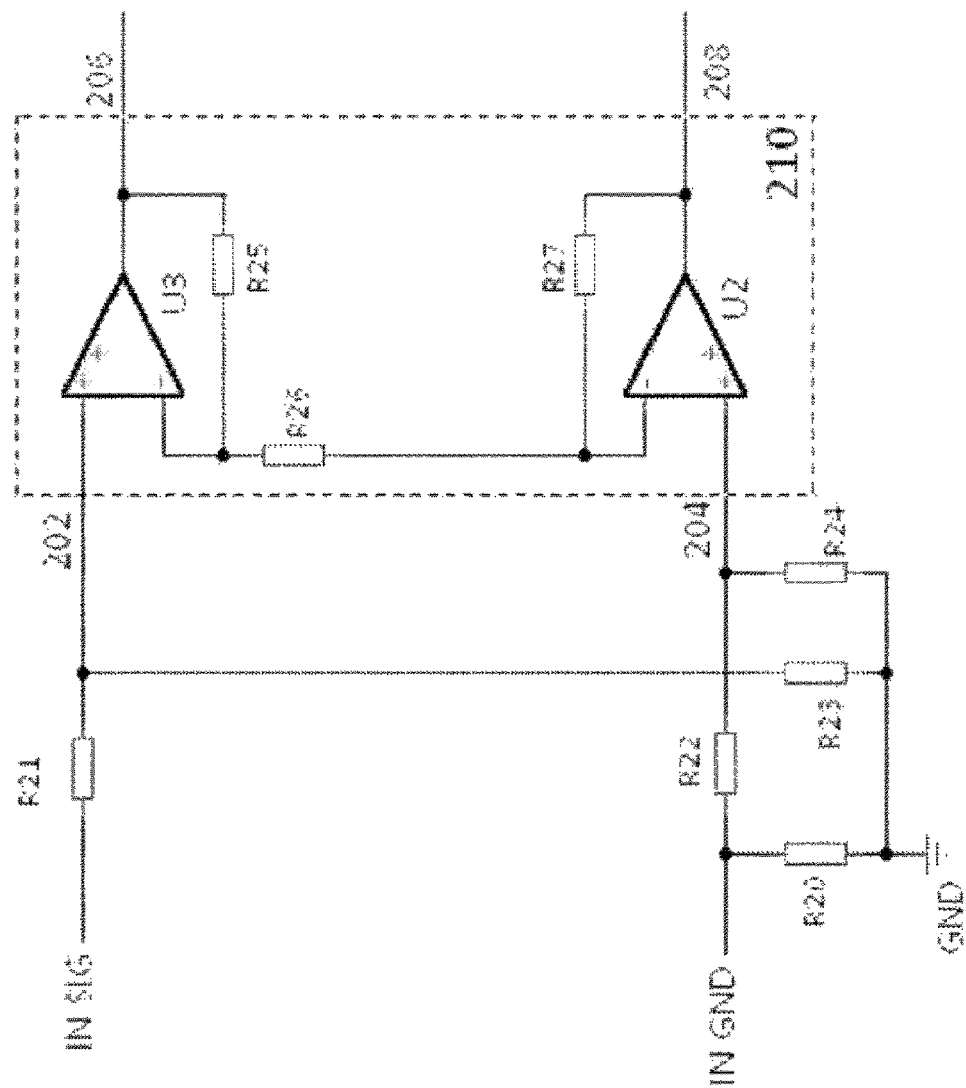
FIG. 2 is another example structural diagram of a single-ended analog signal receiver apparatus according to one or more embodiments of the present disclosure.

In one example, as shown in FIG. 2, single-ended analog signal receiver apparatus 200 receives a single-ended analog input signal at an input terminal. An input signal terminal and an input reference terminal are marked as IN SIG and IN GND, respectively. Input reference terminal IN GND is connected in series to floating ground resistor R20 and connected to local ground terminal GND.

Buffer gain unit 210 is arranged in single-ended analog signal receiver apparatus 200, and has one input terminal 202 and the other input terminal 204. Input signal terminal IN SIG is connected in series to resistor R21 first and then connected to single-ended signal input terminal 202 of buffer gain unit 210. Similarly, input reference terminal IN GND is connected in series to resistor R22 first and then connected to the other input terminal 204 of buffer gain unit 210. In addition, voltage dividing resistors R23 and R24 are connected in series between input terminal 202 and input terminal 204 of buffer gain unit 210 respectively and then connected to local ground terminal GND. If voltage dividing resistors R23 and R24 are matched to the same resistance value, input terminal 202 and input terminal 204 of buffer gain unit 210 may be respectively formed as positive and negative sides with respect to ground terminal GND. After matching the input impedance, the resistance value of resistor R21 is matched with that of R22, and the resistance value of resistor R23 is matched with that of R24, that is, R21=R22 and R23=R24, so that single-ended analog signal receiver apparatus 200 has a balanced input impedance.

Single-ended analog signal receiver apparatus 200 may have a configuration similar to an instrumentation amplifier. The instrumentation amplifier has a common mode rejection of 0, and just delivers a common mode signal directly to a next-stage circuit (not shown). Therefore, in buffer gain unit 210, the common mode signal is buffered and then delivered to the next-stage circuit for eliminating the noise. The next-stage circuit may be a post-stage balance circuit unit with a common mode rejection function, such as a differential amplifier, but may have a relatively low impedance and thus low noise. Alternatively, the next stage may also be connected to some other common mode elimination apparatuses.

Buffer gain unit 210 of single-ended analog signal receiver apparatus 200 shown in FIG. 2 converts the received single-ended analog input signal into a differential output signal for output at output terminals 206 and 208.

Buffer gain unit 210 includes a first amplifier with operational amplifier U3 as the main body, a second amplifier with operational amplifier U2 as the main body, and gain resistors R25, R26, and R27. Gain resistor R25 is connected between an output terminal and an inverting input terminal of operational amplifier U3. Gain resistor R26 is connected between respective inverting input terminals of two operational amplifiers U3 and U2. Gain resistor R27 is connected between the inverting input terminal and an output terminal of operational amplifier U2. Respective output terminals 206 and 208 of two operational amplifiers U3 and U2 in buffer gain unit 210 are coupled to the output terminal of buffer gain unit 210 to form a differential output.

Advantageously, buffer gain unit 210 may be intentionally arranged to unbalance gains on the positive and negative sides. The gain of the first amplifier at the single-ended signal input terminal is $G3=(1+(R25/R26))$. The second amplifier at the other input terminal has dual purposes, the first function is amplifying the inverting of the input signal, with a gain of $G2=R27/R26$, and the second function is acting as a tracking amplifier for the floating ground signal generated by floating ground resistor R20. Therefore, the resistance value on the gain resistor is set as $R27=R25+R26$, and the balanced output terminal may have a symmetrical output for the single-ended useful signal. For the common mode noise signal, a unity-gain may be accurately obtained despite of a tolerance, and then processed by a post-stage conventional low-noise circuit.

An example configuration of single-ended analog signal receiver apparatus 200 is that the resistance value of the floating ground resistor R20 is configured to be 5 Ohm, the resistance values of series-connected resistors R21 and R22 are matched to 100 Ohm, and the resistance values of series-connected voltage dividing resistor R23 and R24 are matched to 47 k Ohm. A sum of the resistance values of gain resistors R25 and R26 is matched with the resistance value of R27, so that the resistance value of R25 is 1.6 k Ohm, the resistance value of R26 is 500 Ohm, and the resistance value of R27 is the sum of the resistance values of R25 and R26, that is, the resistance value of R27 is 2.1K Ohm.

Therefore, by using the unbalanced instrumentation amplifier provided by single-ended analog signal receiver apparatus 200, the input single-ended signal may be converted into a balanced differential signal, and at the same time, it has no effect on the common mode useless noise, thereby facilitating subsequent arrangement of a low noise differential stage to eliminate useless noise.

As mentioned in the technical solutions described above, the injection of a ground current into a floating ground component may generate noise. These ground currents may come from a variety of different noise sources, usually from low-cost switch-type power supplies that are not grounded, such as chargers commonly used in laptops, cell phones, and tablets. A parasitic transformer winding capacitance is a source of noise, but is often overwhelmed by a large Y capacitance value designed in a common power supply unit (PSU). Here, the Y capacitance refers to a capacitance between a live wire or neutral wire of an AC power input and a signal ground. For solid-state input grounds, these ground currents still exist, but are generally acceptable. When the case occurs in the above solution, due to the imbalance of the input impedance seen from the source end, the differential input is not always capable of eliminating the noise of the current flowing through the floating ground component.

Figure 3:
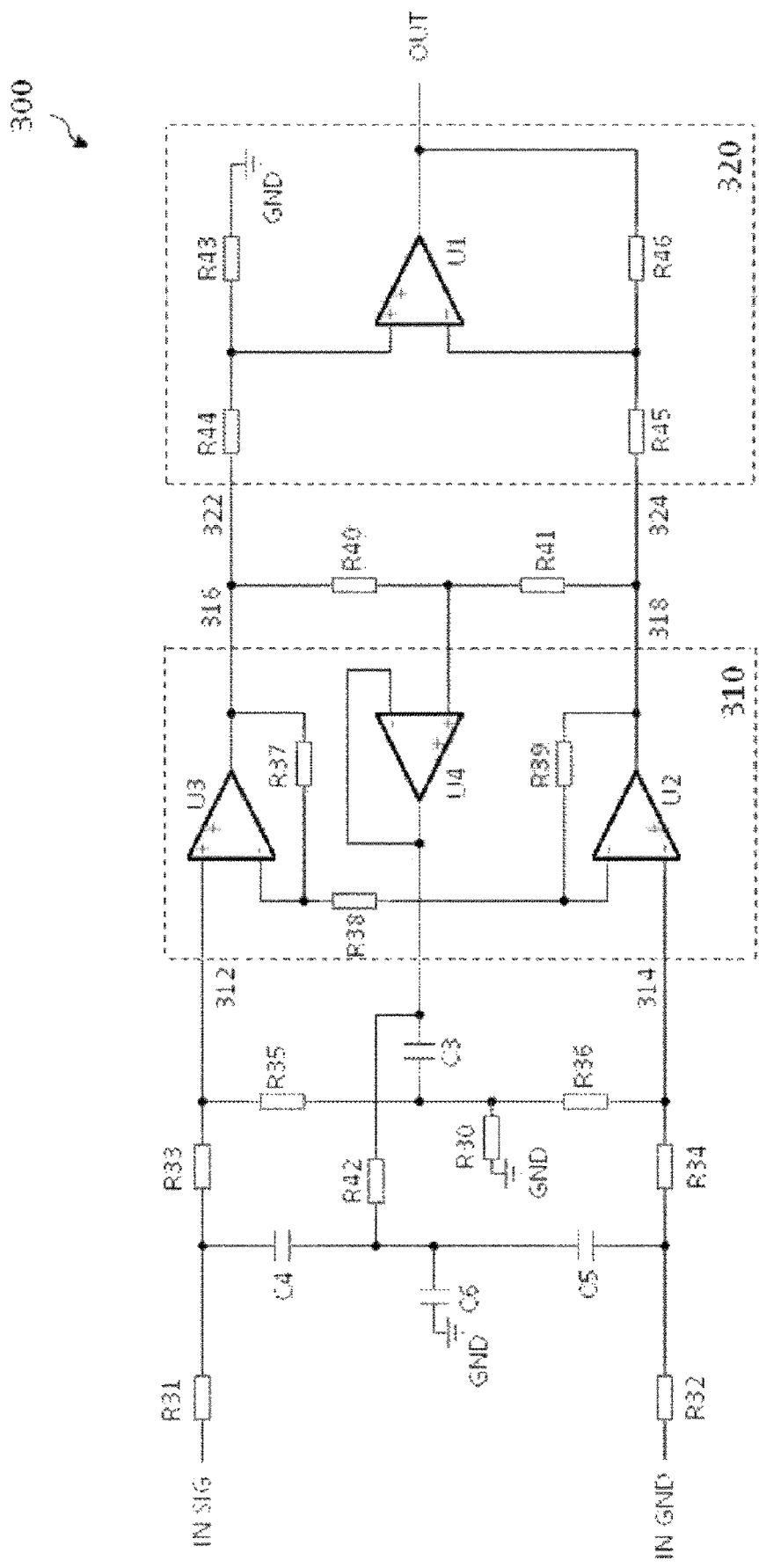
FIG. 3 is still another example structural diagram of a single-ended analog signal receiver apparatus according to one or more embodiments of the present disclosure.

In still another example of the present disclosure, as shown in FIG. 3, single-ended analog signal receiver apparatus 300 receives a single-ended analog input signal from a signal input terminal. The signal input terminal is marked as IN SIG, and an input reference terminal is marked as IN GND. Input signal terminal IN SIG includes output impedance R31, input reference terminal IN GND includes output impedance R32, and output impedances R31 and R32 are unmatched. Unmatched output impedances R31 and R32 come from different sources, which may come from various stages of source outputs, as well as cables, connectors, or the like. Therefore, the unmatched output impedances need to be overcome in the receiver circuit.

Referring to FIG. 3, single-ended analog signal receiver apparatus 300 is shown to include buffer gain unit 310 and post-stage balance circuit unit 320. Buffer gain unit 310 includes first buffer gain input terminal 312 and second buffer gain input terminal 314. Input signal terminal IN SIG is first connected in series to resistor R33 and then connected to first buffer gain input terminal 312 of buffer gain unit 310. Input reference terminal IN GND is first connected in series to resistor R34 and then connected to second buffer gain input terminal 314 of buffer gain unit 310. Voltage dividing resistors R35 and R36 are connected in series between first buffer gain input terminal 312 and second buffer gain input terminal 314 of buffer gain unit 310, and bias resistor R30 is connected between local ground terminal GND and a node between voltage dividing resistors R35 and R36. Therefore, the input reference terminal of a single-ended analog input signal is ground lifted through resistors R34, R36, and R30, and the ground current flows through R34+R36+R30 to become a floating ground signal in the form of a common mode noise voltage.

Buffer gain unit 310 includes first operational amplifier U3 and second operational amplifier U2. Gain resistor R37 is connected to an inverting input terminal and an output terminal of first operational amplifier U3, and the output terminal of first operational amplifier U3 is connected to first buffer gain output terminal 316 of buffer gain unit 310. Gain resistor R38 is connected to respective inverting input terminals of operational amplifier U3 and second operational amplifier U2. Gain resistor R39 is connected to the inverting input terminal and an output terminal of second operational amplifier U2, and the output terminal of second operational amplifier U2 is connected to second buffer gain output terminal 318 of buffer gain unit 310.

The input impedances of single-ended analog signal receiver apparatus 300 are not matched and balanced. Therefore, as previously mentioned, due to the input impedance imbalance seen from the source end, the method of converting to a differential input to the post stage in the receiver apparatus is not always capable of eliminating the ground current noise. In order to correct the input impedance, buffer gain unit 310 of single-ended analog signal receiver apparatus 300 is further provided with unity-gain amplifier U4, and a structure of which is an operational amplifier with a non-inverting input terminal as an input and an inverting input terminal connected to an output terminal. As shown in FIG. 3, the unity-gain amplifier U4, together with feedback capacitor C3 connected in series therewith, is connected between a node between resistors R40 and R41 of the same resistance value and a node between resistors R35, R36 and R30. Resistors R40 and R41 are connected in series between two output terminals 316 and 318 of buffer gain unit 310, and resistors R35 and R36 are connected in series between two input terminals 312 and 314 of buffer gain unit 310.

A common mode gain of buffer gain unit 310 in single-ended analog signal receiver apparatus 300 is substantially 1, and a common mode output of the buffer gain unit 310 is coupled to unity-gain amplifier U4 through resistors R40 and R41. Unity-gain amplifier U4 receives a common mode portion of a signal, which is buffered by unity-gain amplifier U4 and feedback capacitor C3, and the node between resistors R35, R36, and R30 is driven by the buffered common mode signal. As a result, at a frequency higher than a cutoff frequency fc1 of approximately 1 Hz (the cutoff frequency is a frequency at which an impedance of feedback capacitor C3 is equal to a resistance value of resistor R30), the voltage at the node between resistors R35 and R36 is boosted to track an input common mode signal, and the current flowing through resistors R35 and R36 is significantly reduced, causing resistors R35 and R36 to exhibit very high and equal AC impedances for the common mode signal.

Therefore, unity-gain amplifier U3 presents the common mode portion of the signal to the input impedance, thereby effectively bootstrapping and balancing the input impedance in such a way that, although the input impedance is low for the impedance of the differential signal, no common mode signal is affected because the input impedance for the common mode signal is high. In this way, the receiver apparatus is more efficient in the case of unmatched output impedances R31 and R32 at the receiving position, and this requires only the addition of unity-gain amplifier U4.

As can be seen from the foregoing, a condition for maintaining effective noise elimination is ensuring that R39=R37+R38 and R33/R35=R34/R36. Advantageously, single-ended analog signal receiver apparatus 300 may be configured such that R33+R35 is substantially larger than R34+R36, in combination with R39=R37+R38. Moreover, in the floating ground resistor, the resistance value R34+R36 realizes the bootstrap via feedback capacitor C3.

Therefore, single-ended analog signal receiver apparatus 300 outputs the high-gain differential signal and the relatively suppressed common mode noise to the subsequent post-stage balance circuit unit through unbalanced buffer gain unit 310 to eliminate noise. At the same time, by configuring the resistance values so that the resistance value R33+R35 is significantly larger than R34+R36, it is avoided that the floating ground noise signal is too large to saturate the operational amplifier. The unbalanced input impedances are also suitable for reducing the floating ground signal to be within a voltage range of the circuit, but at the same time floating ground resistors R34+R36 may present bootstrapping through feedback filter C3, and the circuit remains high and equal input impedance at both ends for the common mode noise signal.

On the other hand, single-ended analog signal receiver apparatus 300 may further include filter capacitors C4 and C5 connected in series between its input signal terminal IN SIG and input reference terminal IN GND, and filter capacitor C6 connected between a node between filter capacitors C4 and C5 and local ground terminal GND as a local reference. In addition, filter resistor R42 is further included, which is connected between an output terminal of unity-gain amplifier U4 and a node between filter capacitors C4, C5, and C6.

Through the configuration, filter resistor R42 and filter capacitor C6 may constitute a low-pass filter whose cutoff frequency fc2 is preferably above 50000 Hz. At a frequency lower than the cutoff frequency fc2, the node between filter capacitors C4 and C5 is bootstrapped so that the AC current flowing through filter capacitors C4 and C5 is reduced, thereby eliminating their influence to the common mode rejection ratio of single-ended analog signal receiver apparatus 300 in terms of audio frequency. Meanwhile, at a frequency higher than the cutoff frequency fc2, filter capacitor C6 provides sufficient floating ground paths for filter capacitors C4 and C5 to prevent radio frequency signals from reaching operational amplifiers U3 and U2. Advantageously, filter capacitor C5 may be larger than C4 here to match values of smaller resistors R34 and R36, while smaller filter capacitor C4 is configured to match resistors R33 and R35, in such a way that a high common mode rejection ratio is maintained. An example configuration here is that capacitor C5 is set to a relatively large value, such as 10 nF, to match resistance values of smaller resistors R34 and R36, such as 100 Ohm for R34 and 1 k Ohm for R36. Capacitor C4 may be set as small as, for example, 100 pF to match resistance values of larger resistors R33 and R35, such as 10 k Ohm for R33 and 100 k Ohm for R35, thus maintaining the high common mode rejection ratio.

Therefore, single-ended analog signal receiver apparatus 300 provides good common mode noise rejection over the entire audio frequency range, while further suppressing the radio frequency noise. In an example configuration of single-ended analog signal receiver apparatus 300, resistor R33 having a resistance value of 10 k Ohm and resistor R35 having a resistance value of 100 k Ohm are connected in series to the signal input terminal. Resistor R34 having a resistance value of 100 Ohm and resistor R36 having a resistance value of 1 k Ohm are connected in series to the other end, thereby ensuring the matching condition of R33/R35=R34/R36 for the differential signal.

In addition, resistances of resistors R40 and R41 are matched to 10 k Ohm, and resistances of gain resistors R37, R38, and R39 are 6.2 k, 2 k, and 8 k Ohm, respectively, thereby ensuring the matching condition of R39=R37+R38.

Capacitances of filter capacitors C4 and C5 may be configured on the order of 100 pF and 10 nF, respectively. For other passive components, for example, a resistance value of resistor R30 is about 10 k Ohm, a resistance value of filter resistor R42 is about 2 k Ohm, and a capacitance of feedback capacitor C3 may be configured on the order of 100 uF.

So far, the single-ended signal input into single-ended analog signal receiver apparatus 300 may be converted into a differential signal through buffer gain unit 310, and at the same time, the common mode useless noise is delivered to the output of buffer gain unit 310 with unity-gain. Then, single-ended analog signal receiver apparatus 300 eliminates useless noise through a low-noise differential stage of a post-stage circuit such as post-stage balance circuit unit 320. Two output terminals 316 and 318 of buffer gain unit 310 are respectively connected to two input terminals 322 and 324 of post-stage balance circuit unit 320. In the example of FIG. 3, post-stage balance circuit unit 320 is similar to a differential amplifier, which includes operational amplifier U1 and a voltage mode differential amplifier composed of four matching gain resistors R43, R44, R45, and R46. That is, gain resistor R43 is connected a non-inverting input terminal of operational amplifier U1 and local ground terminal GND, gain resistor R44 is connected to the non-inverting input terminal of operational amplifier U1 and input terminal 322 of post-stage balance circuit unit 320, gain resistor R45 is connected to an inverting input terminal of operational amplifier U1 and input terminal 324 of post-stage balance circuit unit 320, and gain resistor R46 is connected to the inverting input terminal and an output terminal of operational amplifier U1. The output terminal of operational amplifier U1 is connected to output terminal OUT of single-ended analog signal receiver apparatus 300. In one example configuration, gain resistors R43, R44, R45, and R46 may be completely matched to all having the same resistance, for example, 10 k Ohm. Therefore, post-stage balance circuit unit 320 in the form of a differential amplifier eliminates the common mode noise through common mode rejection and can output a differential output signal with lower noise at output terminal OUT. Alternatively, for differential gain and headroom needs, it is only required that gain resistors R44 and R45 are matched, and R43 and R46 are matched, and a better match results in a more complete common mode rejection.

For a signal source with a high output impedance, the single-ended analog signal receiver apparatus need to have a high input impedance. In addition, it is required to drive a post-stage circuit with a low input impedance, the single-ended analog signal receiver apparatus needs to have a very low output impedance.

Figure 4:
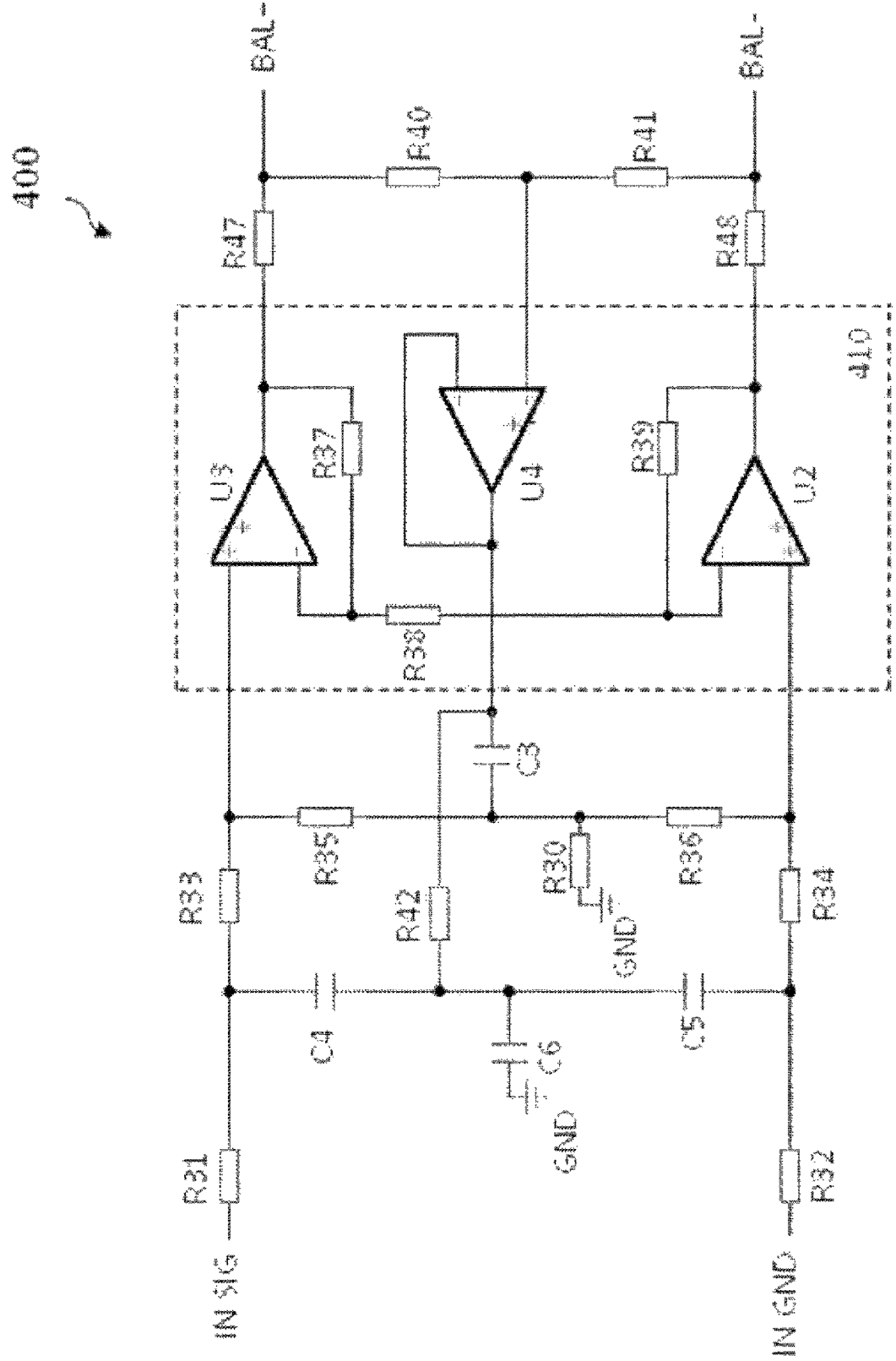
FIG. 4 is an example application scenario in which the single-ended analog signal receiver apparatus shown in FIG. 3 is configured to drive a post-stage balance circuit with a CMRR according to one or more embodiments of the present disclosure.

FIG. 4 shows example configuration 400 of applying single-ended analog signal receiver apparatus 300 shown in FIG. 3 to a post-stage balance circuit for driving a low signal input headroom. The input single-ended analog input signal is converted into a balanced differential signal by the single-ended analog signal receiver apparatus, which may be used for driving, for example, an analog-to-digital converter (ADC), conditioning a high-fidelity audio signal, and the like. For such a balance circuit with a low input impedance, this part of the single-ended analog signal receiver apparatus in FIG. 4 needs to be equipped with a low and balanced output signal. As shown in FIG. 4, a difference between single-ended analog signal receiver apparatus configuration 400 and receiver apparatus 300 in FIG. 3 is that the output impedance of buffer gain unit 410 is further reconfigured except that the specific post-stage circuit is not shown. Specifically, output terminals 406 and 408 of buffer gain unit 410 are first connected in series to resistors R47 and R48, respectively, and then resistors R40 and R41 are connected in series between two balanced output terminals BAL+ and BAL− of the single-ended analog signal receiver apparatus. An example configuration of the resistors here is reducing, in a matched manner, the resistance values of series-connected resistors R40 and R41 to 120 Ohm, and setting, in a matched manner, the resistance values of series-connected resistors R47 and R48 to 1 k Ohm. With this configuration, the output impedance of buffer gain unit 410 is reduced, and differential signals output from balanced output terminals BAL+ and BAL− may be used for driving a post-stage balance circuit with a low input signal, for example, it may be used as an input of the analog-to-digital converter circuit ADC.

Figure 5:
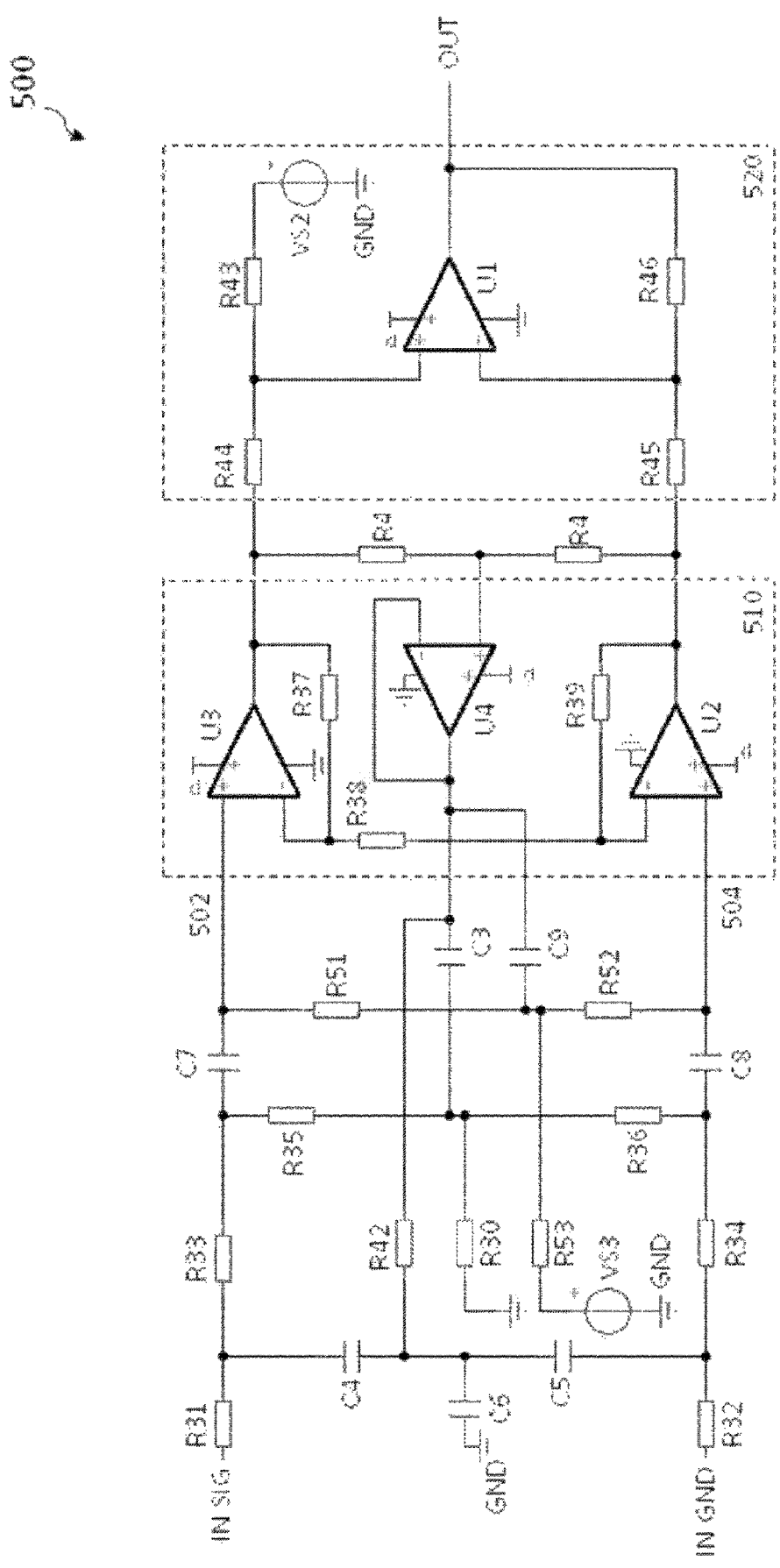
FIG. 5 is an example application scenario in which the single-ended analog signal receiver apparatus shown in FIG. 3 is configured as a single power supply rail capable of powering an electrical component connected to the receiver according to one or more embodiments of the present disclosure.

Another challenging example application of the single-ended analog signal receiver apparatus provided by the present disclosure is shown in FIG. 5, and configuration 500 of the single-ended analog signal receiver apparatus is implemented as an AC coupled and low single voltage power rail application. The method may use a defined point between local ground terminal GND and the power rail as a voltage reference, without affecting the performance of the unbalanced single-ended analog signal receiver apparatus.

In the previously described examples, the operational amplifiers of the single-ended analog signal receiver apparatus are all powered from dual rail power supplies. It has been shown in FIG. 5 that negative poles of all power supply units are connected to the ground terminal, thereby switching to a single-ended rail for power supply. In addition, in example configuration 500 of the single-ended analog signal receiver apparatus shown in FIG. 5, a difference from single-ended analog signal receiver apparatus 300 shown in FIG. 3 is that after input signal terminal IN SIG and input reference terminal IN GND of the single-ended analog signal are connected in series to resistors R33 and R34, respectively, they are further connected in series to filter capacitors C7 and C8, respectively. Filter capacitors C7 and C8 are configured to matched capacitance values, for example, C7=C8=100 nF, so that an input single-ended signal can be centered on local ground terminal GND.

In addition, after filter capacitors C7 and C8 are connected in series between the input terminals of the receiver apparatus, another pair of series-connected resistors R51 and R52 is newly connected between two input terminals 502 and 504 of buffer gain unit 510. Another resistor R53 is provided, one end of which is connected to a node between resistors R51 and R52, and the other end is not directly grounded, but has power supply VS3 provided between it and ground terminal GND. Feedback capacitor C9 is connected between the output terminal of unity-gain amplifier U4 and a node between resistors R51, R52, and R53, a value of which may be configured to be, for example, 10 uF. Resistors R51 and R52 are connected in series between two input terminals 502 and 504 of buffer gain unit 510 and have matching resistance values of 2.7 MEG.

For application example configuration 500 of the single-ended analog signal receiver apparatus, the respective bias resistance values in buffer gain unit 510 also need to be changed relative to receiver apparatus 300 shown in FIG. 3 to avoid clipping. Two amplifiers U2 and U3 must have gains in buffer gain unit 510 to convert a single-ended signal to a differential signal. For example, it is configured that gain resistor R37 is 2 k Ohm, R38 is 10 k Ohm, and R39 is 12 k Ohm. To avoid clipping an input stage due to resistors R33, R35 and R34, R36, the signal may be attenuated first. Likewise, the differential amplifier in post-stage balance circuit unit 520 also needs signal attenuation to avoid clipping. Additionally, resistors R51, R52, and R53 will provide current paths for required power supply and DC bias currents, while exhibiting high impedances at audio frequencies. Therefore, the single-ended analog signal receiver apparatus will eliminate a source impedance effect that may degrade the CMRR of the amplifier.

As shown in FIG. 5, voltage source VS3 provided between power supply bias resistor R53 and local ground terminal GND may be used as a single-ended AC power supply for those low-impedance components. VS3 is usually around half of the voltage of the supply unit, that is, VCC/2. A negative pole of the single-rail voltage source VS3 is ground terminal GND, and therefore, the signal may occupy any voltage between VCC and GND. In addition, single-rail power supply VS2 provided at gain resistor R43 of post-stage balance circuit unit 520 is usually the same, but may also be biased to adapt to the next part of the circuit. By connecting resistor R53 to power supply VS3 rather than the local ground terminal, a low-voltage single-ended power supply is provided for an electrical device connected to the input terminal of the single-ended analog signal receiver apparatus. Therefore, the input single-ended signal is first centered on local ground terminal GND, and then connected to two inputs 502 and 504 of buffer gain stage 510. When reaching operational amplifiers U2 and U3, the signal has its level converted to be centered on the voltage of single-rail power supply VS3 between bias resistor R53 and ground terminal GND.

At least one technical advantage of the disclosed single-ended analog signal receiver apparatus according to the present disclosure includes that depending on a value configuration of various components in the circuit, it may be realized that there may not be a need to add additional devices, and a lower noise output signal is obtained under the same or even better common mode rejection. At the same time, the single-ended analog signal receiver apparatus provided by the present disclosure also considers electromagnetic compatibility and can cope with an external ground current and an undefined impedance through an AC bootstrap input impedance.

A single-ended analog signal receiver apparatus for receiving a single-ended analog signal from an input signal terminal and outputting an output signal relative to a local ground terminal at an output terminal is involved in the present disclosure, and includes the following content:

Item 1: In one or more embodiments, a single-ended analog signal receiver apparatus provided by the present disclosure includes but is not limited to items listed below:
  a post-stage balance circuit unit with a common mode rejection function, the post-stage balance circuit unit including:
    a first post-stage input terminal connected to the input signal terminal of the single-ended analog signal receiver apparatus;
    a second post-stage input terminal, and
    a post-stage output terminal connected to the output terminal of the single-ended analog signal receiver apparatus;
  a buffer gain unit, including:
    a first buffer gain input terminal connected to an input reference terminal of the single-ended analog signal receiver apparatus;
    a second buffer gain input terminal connected to the local ground terminal, and
    a buffer gain output terminal connected to the second post-stage input terminal of the post-stage balance circuit unit; and
  a bias resistor connected between the input reference terminal of the single-ended analog signal receiver apparatus and the local ground terminal.

Item 2: The single-ended analog signal receiver apparatus according to item 1, wherein the buffer gain unit further includes a first operational amplifier, a first gain resistor, and a second gain resistor,
  wherein a non-inverting input terminal of the first operational amplifier is connected to the first buffer gain input terminal, the first gain resistor is connected between an output terminal and an inverting input terminal of the first operational amplifier, the second gain resistor is connected between the inverting input terminal of the first operational amplifier and the second buffer gain input terminal, and the output terminal of the first operational amplifier is connected to the buffer gain output terminal.

Item 3: The single-ended analog signal receiver apparatus according to items 1 to 2, wherein
  the post-stage balance circuit unit further includes a second operational amplifier, a third gain resistor, a fourth gain resistor, a fifth gain resistor, and a sixth gain resistor, and wherein
  the third gain resistor is connected between a non-inverting input terminal of the second operational amplifier and the first post-stage input terminal of the post-stage balance circuit unit, the fourth gain resistor is connected between the non-inverting input terminal of the second operational amplifier and the local ground terminal, the fifth gain resistor is connected between an inverting input terminal and an output terminal of the second operational amplifier, the sixth gain resistor is connected between the second post-stage input terminal of the post-stage balance circuit unit and the inverting input terminal of the second operational amplifier, and the output terminal of the second operational amplifier is connected to the post-stage output terminal of the post-stage balance circuit unit.

Item 4: The single-ended analog signal receiver apparatus according to items 1 to 3, wherein the post-stage balance circuit unit includes a differential amplifier.

Item 5: The single-ended analog signal receiver apparatus according to items 1 to 4, wherein resistance values of the first gain resistor and the sixth gain resistor are matched, and resistance values of the second gain resistor and fifth gain resistor are matched.

Item 6: The single-ended analog signal receiver apparatus according to items 1 to 5, wherein the buffer gain unit further includes a compensation resistor, the compensation resistor and the second gain resistor are connected in series between the inverting input terminal of the first operational amplifier and the local ground terminal to compensate for attenuation of impedances of the third and fourth gain resistors of the post-stage balance circuit unit and attenuation of an input impedance of the single-ended analog signal receiver apparatus.

Item 7: The single-ended analog signal receiver apparatus according to items 1 to 6, wherein the compensation resistor is capable of being incorporated into the second gain resistor.

Item 8: A single-ended analog signal receiver apparatus for receiving a single-ended analog signal from an input signal terminal and outputting an output signal relative to a local ground terminal at an output terminal, the single-ended analog signal receiver apparatus including:
  a buffer gain unit, including:
    a first buffer gain input terminal and a second buffer gain input terminal;
    a first buffer gain output terminal and a second buffer gain output terminal;
    a first bias resistor connected between the input reference terminal and the local ground terminal;
    a second bias resistor connected between the input signal terminal of the single-ended analog signal receiver apparatus and the first buffer gain input terminal of the buffer gain unit;
    a third bias resistor connected between the input reference terminal of the single-ended analog signal receiver apparatus and the second buffer gain input terminal of the buffer gain unit;
    a fourth bias resistor connected between the first buffer gain input terminal of the buffer gain unit and the local ground terminal; and
    a fifth bias resistor connected between the second buffer gain input terminal of the buffer gain unit and the local ground terminal,
  a post-stage balance circuit unit with common mode rejection, the post-stage balance circuit unit including:
    a first post-stage input terminal connected to the first buffer gain output terminal of the buffer gain unit;
    a second post-stage input terminal connected to the second buffer gain output terminal of the buffer gain unit, and
    a post-stage output terminal connected to the output terminal of the single-ended analog signal receiver apparatus.

Item 9: The single-ended analog signal receiver apparatus according to item 8, wherein
  the buffer gain unit further includes a first operational amplifier and a second operational amplifier, and a first gain resistor, a second gain resistor, and a third gain resistor, wherein
  a non-inverting input terminal of the first operational amplifier is connected to the first buffer gain input terminal of the buffer gain unit, a non-inverting input terminal of the second operational amplifier is connected to the second buffer gain input terminal of the buffer gain unit, the first gain resistor is connected between an inverting input terminal and an output terminal of the first operational amplifier, the second gain resistor is connected between the inverting input terminal of the first operational amplifier and an inverting input terminal of the second operational amplifier, and the third gain resistor is connected between the inverting input terminal and an output terminal of the second operational amplifier, wherein
  the respective output terminals of the first operational amplifier and the second operational amplifier are connected to the first buffer gain output terminal and the second buffer gain output terminal of the buffer gain unit, respectively.

Item 10: The single-ended analog signal receiver apparatus according to items 8 to 9, wherein resistance values of the second bias resistor and the third bias resistor are matched, and resistance values of the fourth bias resistor and the fifth bias resistor are matched.

Item 11: The single-ended analog signal receiver apparatus according to items 8 to 10, where a resistance value of the third gain resistor matches a sum of resistance values of the first and second gain resistors.

Item 12: The single-ended analog signal receiver apparatus according to items 8 to 11, wherein the post-stage balance circuit unit includes a differential amplifier.

Item 13: A single-ended analog signal receiver apparatus for receiving a single-ended analog signal from an input signal terminal and outputting an output signal relative to a local ground terminal at an output terminal, the single-ended analog signal receiver apparatus including:
  a buffer gain unit, including:
    a first buffer gain input terminal and a second buffer gain input terminal;
    a first buffer gain output terminal and a second buffer gain output terminal, a first bias resistor and a second bias resistor connected in series between the first buffer gain input terminal and the second buffer gain input terminal of the buffer gain unit;

a third bias resistor connected between a node between the first bias resistor and the second bias resistor and the local ground terminal;

a fourth bias resistor connected between the input signal terminal of the single-ended analog signal receiver apparatus and the first buffer gain input terminal of the buffer gain unit;

a fifth bias resistor connected between an input reference terminal of the single-ended analog signal receiver apparatus and the second buffer gain input terminal of the buffer gain unit;

a sixth bias resistor and a seventh bias resistor connected in series between the first buffer gain output terminal and the second buffer gain output terminal of the buffer gain unit;

a unity-gain amplifier unit including an input terminal and an output terminal, wherein the input terminal of the unity-gain amplifier unit is connected to a node between the sixth and seventh bias resistors;

a first capacitor connected between the output terminal of the unity-gain amplifier unit and a node between the first, second, and third bias resistors, the first capacitor being sized to have an impedance less than a resistance value of the third bias resistor at a frequency higher than a first predetermined frequency;

a second capacitor and a third capacitor connected in series between the input signal terminal and the input reference terminal of the unity-gain amplifier unit;

a fourth capacitor connected between a node between the second capacitor and the third capacitor and the local ground terminal; and an eighth bias resistor connected between the output terminal of the unity-gain amplifier unit and a node between the second, third, and fourth capacitors, the fourth capacitor being sized to have an impedance less than a resistance value of the eighth bias resistor at a frequency lower than a second predetermined frequency, a post-stage balance circuit unit with common mode rejection, the post-stage balance circuit unit comprising:

a first post-stage input terminal and a second post-stage input terminal connected to the first buffer gain output terminal and the second buffer gain output terminal of the buffer gain unit, respectively, and a post-stage output terminal connected to the output terminal of the single-ended analog signal receiver apparatus.

Item 14: The single-ended analog signal receiver apparatus according to item 13, wherein a resistance value ratio of the fourth bias resistor to the first bias resistor matches a resistance value ratio of the fifth bias resistor to the second bias resistor.

Item 15: The single-ended analog signal receiver apparatus according to items 13 to 14, wherein
the buffer gain unit further includes a first operational amplifier and a second operational amplifier, and a first gain resistor, a second gain resistor, and a third gain resistor, wherein
a non-inverting input terminal of the first operational amplifier is connected to the first buffer gain input terminal of the buffer gain unit, a non-inverting input terminal of the second operational amplifier is connected to the second buffer gain input terminal of the buffer gain unit, the first gain resistor is connected between an inverting input terminal and an output terminal of the first operational amplifier, the second gain resistor is connected between the inverting input terminal of the first operational amplifier and an inverting input terminal of the second operational amplifier, and the third gain resistor is connected between the inverting input terminal and an output terminal of the second operational amplifier, wherein
the respective output terminals of the first operational amplifier and the second operational amplifier are connected to the first buffer gain output terminal and the second buffer gain output terminal of the buffer gain unit, respectively.

Item 16: The single-ended analog signal receiver apparatus according to items 13 to 15, where a resistance value of the third gain resistor matches a sum of resistance values of the first and second gain resistors.

Item 17: The single-ended analog signal receiver apparatus according to items 13 to 16, wherein a sum of resistance values of the first bias resistor and the fourth bias resistor is considerably greater than a sum of resistance values of the second bias resistor and the fifth bias resistor.

Item 18: The single-ended analog signal receiver apparatus according to items 13 to 17, where the input signal terminal and the input reference terminal include unmatched output impedances, respectively.

Item 19: The single-ended analog signal receiver apparatus according to items 13 to 18, wherein first predetermined frequency is about 1 Hz, and the second predetermined frequency is about 50,000 Hz.

Item 20: The single-ended analog signal receiver apparatus according to items 13 to 19,
wherein the third capacitor is capable of being set to be considerably large to match the second and fifth bias resistors with small resistance values, and wherein the second capacitor is capable of being set to be small to match resistance values of the first and fourth bias resistors, so as to maintain a high common mode rejection ratio.

Item 21: The single-ended analog signal receiver apparatus according to items 13 to 20, wherein the unity-gain amplifier unit includes a third operational amplifier, a non-inverting input terminal of the third operational amplifier is connected to the input terminal of the unity-gain amplifier unit, and an inverting input terminal of the third operational amplifier is connected to an output terminal of the third operational amplifier, and connected to the output terminal of the unity-gain amplifier unit.

Item 22: The single-ended analog signal receiver apparatus according to items 13 to 21, wherein the post-stage balance circuit unit includes an analog-to-digital converter (ADC) to reduce the output impedance of the buffer gain amplifying unit.

Item 23: The single-ended analog signal receiver apparatus according to items 13 to 22, further including:
a first balancing capacitor added between the connection of the fourth bias resistor and the first buffer gain input terminal of the buffer gain unit;
a second balancing capacitor added between the connection of the fifth bias resistor and the second buffer gain input terminal of the buffer gain unit;
a ninth bias resistor and a tenth bias resistor connected in series between the first buffer gain input terminal of the buffer gain unit and the second buffer gain input terminal of the buffer gain unit, and a fifth capacitor connected between the output terminal of a unity-gain amplifier unit and a node between the ninth bias resistor and the tenth bias resistor, wherein the single-ended analog signal receiver apparatus is further configured to provide a first single-rail power supply for the input signal terminal, a negative pole of the first single-rail power supply is connected to a local reference terminal, and a positive pole, after connected to a power supply bias resistor in series, is connected to the node between the ninth bias resistor and the tenth bias resistor.

Item 24: The single-ended analog signal receiver apparatus according to items 13 to 23, wherein the post-stage balance circuit unit includes a fourth operational amplifier, a fourth gain resistor, a fifth gain resistor, a sixth gain resistor, and a seventh gain resistor, and wherein the fourth gain resistor is connected between a non-inverting input terminal of the fourth operational amplifier and the first post-stage input terminal of the post-stage balance circuit unit, the fifth gain resistor is connected between the non-inverting input terminal of the fourth operational amplifier and the local ground terminal, the sixth gain resistor is connected between an inverting input terminal and an output terminal of the fourth operational amplifier, the seventh gain resistor is connected between the second post-stage input terminal of the post-stage balance circuit unit and the inverting input terminal of the fourth operational amplifier, and the output terminal of the fourth operational amplifier is connected to the post-stage output terminal.

Item 25: The single-ended analog signal receiver apparatus according to items 13 to 24, wherein the post-stage balance circuit unit includes a differential amplifier.

Item 26: The single-ended analog signal receiver apparatus according to items 13 to 25, wherein the single-ended analog signal receiver apparatus is further configured to provide a second single-rail power supply for the output terminal of the post-stage balance circuit unit, wherein the second single-rail power supply is connected in series between the fifth gain resistor and the local ground terminal.

What is claimed is:

1. A single-ended analog signal receiver apparatus for receiving a single-ended analog signal from an input signal terminal and outputting an output signal relative to a local ground terminal at an output terminal, the single-ended analog signal receiver apparatus comprising:
    a buffer gain unit comprising:
        a first buffer gain input terminal and a second buffer gain input terminal;
        a first buffer gain output terminal and a second buffer gain output terminal,
        a first bias resistor and a second bias resistor connected in series between the first buffer gain input terminal and the second buffer gain input terminal of the buffer gain unit;
        a third bias resistor connected between a node between the first bias resistor and the second bias resistor and the local ground terminal;
        a fourth bias resistor connected between the input signal terminal of the single-ended analog signal receiver apparatus and the first buffer gain input terminal of the buffer gain unit;
        a fifth bias resistor connected between an input reference terminal of the single-ended analog signal receiver apparatus and the second buffer gain input terminal of the buffer gain unit;
        a sixth bias resistor and a seventh bias resistor connected in series between the first buffer gain output terminal and the second buffer gain output terminal of the buffer gain unit;
        a unity-gain amplifier unit comprising an input terminal and an output terminal, wherein the input terminal of the unity-gain amplifier unit is connected to a node between the sixth and seventh bias resistors;
        a first capacitor connected between the output terminal of the unity-gain amplifier unit and a node between the first, second, and third bias resistors, the first capacitor being sized to have an impedance less than a resistance value of the third bias resistor at a frequency higher than a first predetermined frequency;
        a second capacitor and a third capacitor connected in series between the input signal terminal and the input reference terminal of the unity-gain amplifier unit;
        a fourth capacitor connected between a node between the second capacitor and the third capacitor and the local ground terminal; and
        an eighth bias resistor connected between the output terminal of the unity-gain amplifier unit and a node between the second, third, and fourth capacitors, the fourth capacitor being sized to have an impedance less than a resistance value of the eighth bias resistor at a frequency lower than a second predetermined frequency,
    a post-stage balance circuit unit with common mode rejection comprising:
        a first post-stage input terminal and a second post-stage input terminal connected to the first buffer gain output terminal and the second buffer gain output terminal of the buffer gain unit, respectively; and
        a post-stage output terminal connected to the output terminal of the single-ended analog signal receiver apparatus.

2. The single-ended analog signal receiver apparatus of claim 1, wherein a resistance value ratio of the fourth bias resistor to the first bias resistor matches a resistance value ratio of the fifth bias resistor to the second bias resistor.

3. The single-ended analog signal receiver apparatus of claim 1, wherein
    the buffer gain unit further comprises a first operational amplifier and a second operational amplifier, and a first gain resistor, a second gain resistor, and a third gain resistor, wherein
    a non-inverting input terminal of the first operational amplifier is connected to the first buffer gain input terminal of the buffer gain unit, a non-inverting input terminal of the second operational amplifier is connected to the second buffer gain input terminal of the buffer gain unit, the first gain resistor is connected between an inverting input terminal and an output terminal of the first operational amplifier, the second gain resistor is connected between the inverting input terminal of the first operational amplifier and an inverting input terminal of the second operational amplifier, and the third gain resistor is connected between the inverting input terminal and an output terminal of the second operational amplifier, wherein
    the respective output terminals of the first operational amplifier and the second operational amplifier are connected to the first buffer gain output terminal and the second buffer gain output terminal of the buffer gain unit, respectively.

4. The single-ended analog signal receiver apparatus of claim 3, wherein a resistance value of the third gain resistor matches a sum of resistance values of the first and second gain resistors.

5. The single-ended analog signal receiver apparatus of claim 3, wherein a sum of resistance values of the first bias resistor and the fourth bias resistor is considerably greater than a sum of resistance values of the second bias resistor and the fifth bias resistor.

6. The single-ended analog signal receiver apparatus of claim 1, where the input signal terminal and the input reference terminal comprise unmatched output impedances, respectively.

7. The single-ended analog signal receiver apparatus of claim 1, wherein first predetermined frequency is about 1 Hz, and the second predetermined frequency is about 50,000 Hz.

8. The single-ended analog signal receiver apparatus of claim 1,
wherein the third capacitor is capable of being set to be considerably large to match the second and fifth bias resistors with small resistance values, and wherein the second capacitor is capable of being set to be small to match resistance values of the first and fourth bias resistors, so as to maintain a high common mode rejection ratio.

9. The single-ended analog signal receiver apparatus of claim 1, wherein the unity-gain amplifier unit comprises a third operational amplifier, a non-inverting input terminal of the third operational amplifier is connected to the input terminal of the unity-gain amplifier unit, and an inverting input terminal of the third operational amplifier is connected to an output terminal of the third operational amplifier and connected to the output terminal of the unity-gain amplifier unit.

10. The single-ended analog signal receiver apparatus of claim 1, wherein the post-stage balance circuit unit comprises an analog-to-digital converter (ADC) to reduce an output impedance of the buffer amplifying unit.

11. The single-ended analog signal receiver apparatus of claim 1, further comprising:
a first balancing capacitor added between the connection of the fourth bias resistor and the first buffer gain input terminal of the buffer gain unit,
a second balancing capacitor added between the connection of the fifth bias resistor and the second buffer gain input terminal of the buffer gain unit,
a ninth bias resistor and a tenth bias resistor connected in series between the first buffer gain input terminal of the buffer gain unit and the second buffer gain input terminal of the buffer gain unit, and
a fifth capacitor connected between the output terminal of a unity-gain amplifier unit and a node between the ninth bias resistor and the tenth bias resistor,
wherein the single-ended analog signal receiver apparatus is further configured to provide a first single-rail power supply for the input signal terminal, a negative pole of the first single-rail power supply is connected to a local reference terminal, and a positive pole, after connected to a power supply bias resistor in series, is connected to the node between the ninth bias resistor and the tenth bias resistor.

12. The single-ended analog signal receiver apparatus of claim 1, wherein the post-stage balance circuit unit comprises a fourth operational amplifier, a fourth gain resistor, a fifth gain resistor, a sixth gain resistor, and a seventh gain resistor, and wherein the fourth gain resistor is connected between a non-inverting input terminal of the fourth operational amplifier and the first post-stage input terminal of the post-stage balance circuit unit, the fifth gain resistor is connected between the non-inverting input terminal of the fourth operational amplifier and the local ground terminal, the sixth gain resistor is connected between an inverting input terminal and an output terminal of the fourth operational amplifier, the seventh gain resistor is connected between the second post-stage input terminal of the post-stage balance circuit unit and the inverting input terminal of the fourth operational amplifier, and the output terminal of the fourth operational amplifier is connected to the post-stage output terminal.

13. The single-ended analog signal receiver apparatus of claim 12, wherein the post-stage balance circuit unit comprises a differential amplifier.

14. The single-ended analog signal receiver apparatus of claim 12, wherein the single-ended analog signal receiver apparatus is further configured to provide a second single-rail power supply for the output terminal of the post-stage balance circuit unit, wherein the second single-rail power supply is connected in series between the fifth gain resistor and the local ground terminal.

* * * * *